United States Patent [19]
Horwitz et al.

[11] Patent Number: 5,854,587
[45] Date of Patent: Dec. 29, 1998

[54] $RE_xM_{1-x}MN_yO_\delta$ FILMS FOR MICROBOLOMETER-BASED IR FOCAL PLANE ARRAYS

[75] Inventors: James Horwitz, Fairfax, Va.; Douglas Chrisey, Bowie, Md.; John T. Caulfield, Santa Barbara; Paul E. Dorsey, Fremont, both of Calif.

[73] Assignee: The United States of America as represented by the Secretary of the Navy, Washington, D.C.

[21] Appl. No.: 883,037

[22] Filed: Jun. 26, 1997

[51] Int. Cl.$^6$ ........................................... H01C 7/10
[52] U.S. Cl. ........................................ 338/22 SD; 428/692
[58] Field of Search ................................ 338/15, 17, 18, 338/22 R, 22 SD; 252/521.1, 520.5

[56] References Cited

U.S. PATENT DOCUMENTS

| | | | |
|---|---|---|---|
| 4,044,601 | 8/1977 | Sakurai et al. | 73/23 |
| 5,450,053 | 9/1995 | Wood | 338/18 |
| 5,536,449 | 7/1996 | Feltz et al. | 252/521 |
| 5,549,977 | 8/1996 | Jin et al. | 428/692 |
| 5,563,331 | 10/1996 | Von Helmolt et al. | 73/31.05 |
| 5,767,673 | 6/1998 | Batlogg et al. | 324/252 |

OTHER PUBLICATIONS

E. O. Wollan et al, "Neutron Diffraction Study of the Magnetic Properties of the Series of Perovskite–Type Compounds [(1–x)La, xCa]MnO$_3$," Physical Review, 100, No. 2, 545–563 (1955).

H.L. Yakel, "On the Structures of some Compounds of the Perovskite Type," Acta Crystl. 8, 394 (1955).

J.S. Horwitz et al, "Pulsed laser deposition of electronic ceramics," Nuclear Instrumentation and Methods in Physics Research B, 121, 371–77 (1997).

Primary Examiner—Teresa J. Walberg
Assistant Examiner—Jeffrey Fwu
Attorney, Agent, or Firm—Thomas E. McDonnell; John Karasek

[57] ABSTRACT

Microbolometers can be made with a thin film composition of matter having a large temperature coefficient of resistance (TCR) as compared to the same material in the bulk form. The composition is a manganite of the formula $$RE_xM_{1-x}Mn_yO_\delta$$

where
RE is Y and the rare earths such as La, Ce, Pr, Nb, Pm, Sm, Eu, Gd, Tb, Dy, Ho, Er, Tm, Yb, Lu, and combinations thereof,
M is a divalent metal such as Ca, Sr, Ba, Pb, and combinations thereof,
x is less than 1,
y is from about 0.75 to about 1.5, and
δ is from about 2.5 to about 4.0.

The microbolometer is made by applying a thin film of the composition on to a substrate such as SiN$_x$ and annealing the deposited film to remove inhomogeneities and to decrease the defects so as to increase the TCR.

12 Claims, 2 Drawing Sheets

$RE_xM_{1-x}MN_yO_\delta$ FILMS FOR MICROBOLOMETER-BASED IR FOCAL PLANE ARRAYS

BACKGROUND OF THE INVENTION

1. Field of the Invention

This invention relates to doped rare earth manganite thin films which can be used to dramatically increase the sensitivity of microbolometer based IR focal plane arrays and for use in high resolution IR imaging systems.

2. Description of the Related Art

Infrared detectors can be of two types, thermal detectors or photon detectors. Photon detectors based are based on semiconducting materials such as HgCdTe or InSb. Photo-excitation of free carriers can be detected in a variety of device geometries. Thermal excitation of charge carriers is minimized by cooling the device. In general, semiconducting based IR detectors have high sensitivities, but are costly and awkward to operate in some applications because of the cooling. The high cost is associated with both the preparation and patterning of the materials and the required refrigeration. MCT (HgCdTe) detectors typically run at 77° K. The maximum upper limit is 100° K. A Sterling cooler uses 3 W to achieve this. In addition, cooling adds size, weight and consumes significant power which limits and even prohibits the use of these devices for portable imaging systems.

Thermal IR detectors are based on either the bolometric or the pyroelectric effect. In a pyroelectric material, the rise in the temperature of a material, associated with the absorption of IR radiation, is converted to a voltage associated with a change in the crystal structure of the absorbing material. In a bolometer, the temperature rise of the detector is determined from the change in the resistance of the structure as it heats up. Thermal detectors offer the possibility for lower cost and lighter weight IR detectors since they do not require external cooling. However, these detectors do not currently offer comparable sensitivity to photon detectors.

Honeywell developed the technology for fabricating bolometers that were very small (microbolometers) based on $Si_3N_4$ microbridges. The bridge dimensions are 50 $\mu$m on edge and can be fabricated in 2D arrays. The microbridge technology has been used to develop a commercial product. The bolometers are coated with a material that has a large change in resistance as the temperature changes. The resistive coating in the product is $V_xO_y$. See, for example, Honeywell U.S. Pat. No. 5,450,053, the entire contents of which is incorporated herein by reference. The figure of merit for the coating is the TCR which is just the normalized fractional change in resistance $((d\Omega/dR)/R)$ for the increase in temperature which is measured at room temperature. For $V_xO_y$, the TCR is given as −0.01 to −0.04 per degree centigrade which is −1% to −4%. The $V_xO_y$ is semiconducting at room temperatures and the increase in temperature results in a decrease in the resistance which accounts for the negative coefficient. The TCR of the $V_xO_y$ of −2% extends over a large temperature range.

The fabrication of the microbolometer involves taking a silicon wafer and depositing a coating of $Si_3N_4$. Using some sophisticated techniques, the $Si_3N_4$ film is etched to form tiny (50 $\mu$m by 50 $\mu$m square) $Si_3N_4$ microbridges. On top of these microbridges an oxide coating is deposited. The microbolometer is just a resonant cavity for the infrared radiation. The radiation absorbed in the microbolometer is measured by measuring the change in the resistance of the coating that has been deposited on the outside of the cavity.

We have performed an analysis the sensitivities of the various elements used in IR focal plane arrays for both photonic and thermal systems. We have developed an unpublished model which is able to accurately predict the detector performance. The model predicts that, in general, the semiconducting devices have far greater sensitivities than the microbolometer arrays and this has been observed experimentally. The model also predicts that the sensitivity of the microbolometer technology would begin to approach the sensitivity of the semiconducting technology if the TCR of the oxide coating could be raised to about 8% and this number can be either positive or negative since only the magnitude of the % change is important.

OBJECTS OF THE INVENTION

It is an object of this invention to provide materials that dramatically increase the sensitivity of microbolometers. These materials have a temperature coefficient of resistance (TCR) from about 4% to 35%. These materials can be used to produce a low cost IR detector that will operate near room-temperature in contrast to the low temperatures of 77° K for photon detectors.

It is a further object of this invention to provide IR detectors having sensitivities that approach the semiconducting detectors based on cooled HgCdTe or InSb at a reduced size, weight and cost.

It is a further object of this invention to provide IR detectors having sensitivities that are equal to or greater than the semiconducting detectors based on cooled HgCdTe or InSb at a reduced size, weight and cost.

It is a further object of this invention to provide improved IR detectors for long wavelength infrared (LWIR) is in the 8–12 $\mu$m range.

It is a further object of this invention to provide light weight infrared imaging systems both for enhanced night vision capabilities and the development of smart munitions.

It is a further object of this invention to provide low cost and light weight sensors for drivers aids, optical navigation and imaging IR security.

It is a further object of this invention to provide high sensitivity and light weight sensors for small pay loads such as remotely piloted vehicles (RPV's), unmanned aerial vehicles (UAV), and inexpensive muzzle flash detection systems.

These and further objects of the invention will become apparent as the description of the invention proceeds.

SUMMARY OF THE INVENTION

We have discovered a new class of materials based on metal doped rare earth manganites which have very large temperature dependent resistivities when applied in thin films. Measured TCRs have been as high as 20–30% measured at 215° K.

The material has a formula of $RE_xM_{1-x}Mn_yO_\delta$ where

RE is Y and the rare earths such as La, Ce, Pr, Nb, Pm, Sm, Eu, Gd, Tb, Dy, Ho, Er, Tm, Yb, Lm, and combinations thereof, M is a divalent metal such as Ca, Sr, Ba, Pb, and combinations thereof, x is less than 1, y is from about 0.75 to about 1.5, and $\delta$ is from about 2.5 to about 4.0.

The material can be used as an improved element for a microbolometer because the material has a high temperature coefficient of resistance (TCR). The material can be applied as a thin film (<about 0.5 μm) on a substrate such as $Si_3N_4$ or $LaAlO_3$ with the preferred microbolometers being made of $Si_3N_4$. The thin films preferably are applied by using a pulsed laser which strikes the material which is positioned near the substrate. The deposited film is then annealed to remove inhomogeneities and to decrease the defects so as to increase the TCR.

DESCRIPTION OF THE PREFERRED EMBODIMENTS

Figure 1:
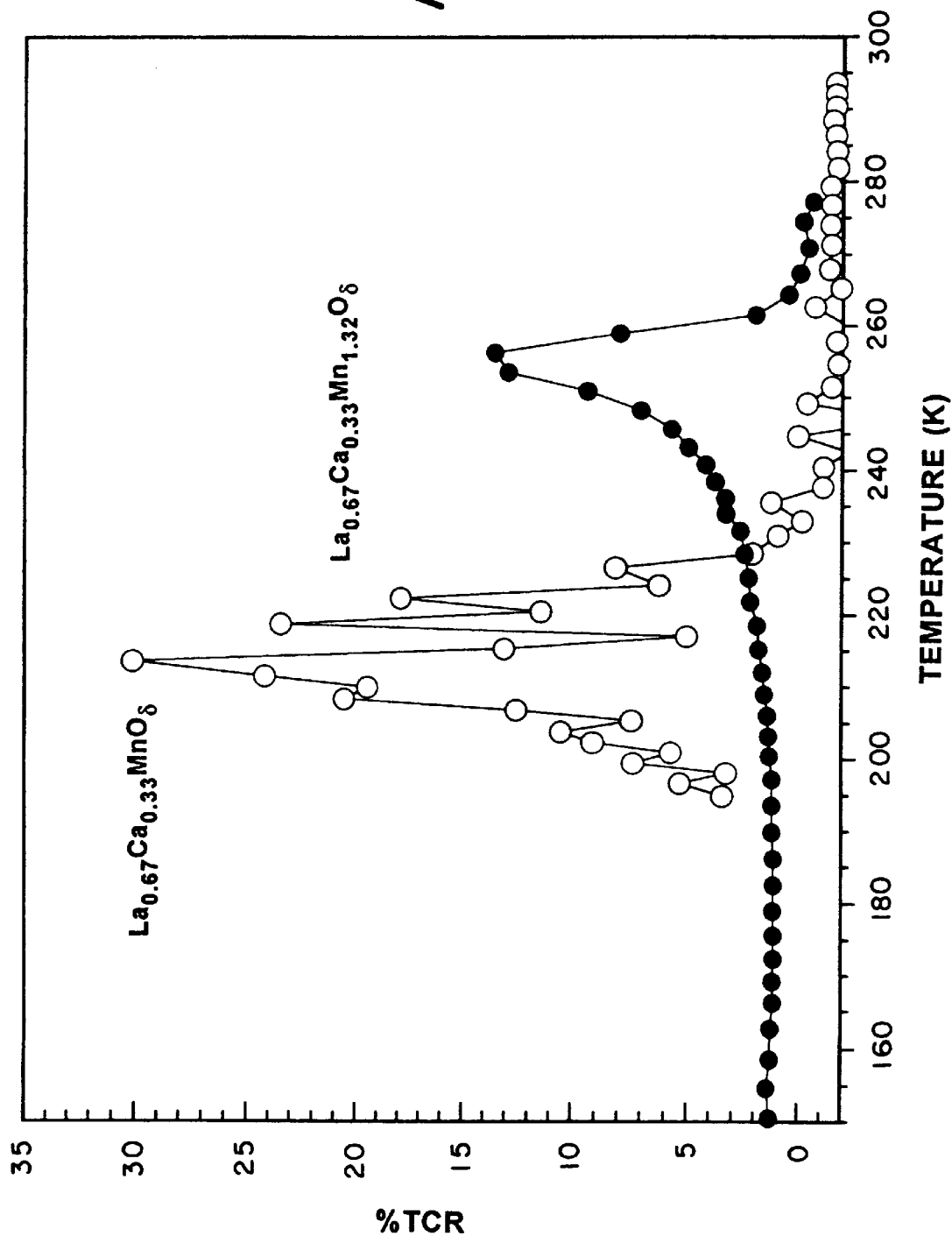
FIG. 1 is a graph of the % TCR values as a function of temperature for two calcium doped La manganites.

The present invention provides materials having a high sensitivity with a TCR from about 4% to 35%, low cost, and room-temperature operation. Thermo-electric (TE) coolers can achieve cold temperatures as low as 150°–175° K and the present materials can operate at temperatures above these obtained by the TE coolers.

Films of new metal doped rare earth manganite materials have been developed and fabricated which have large temperature coefficients of resistance (TCR) which are to be used in conjunction with microbolometer based detectors that operate at room temperature. These detectors will have sensitivities that are equal to or greater that semiconducting detectors based on cooled HgCdTe or InSb at a reduced size, weight and cost. To make these detectors, processing techniques have been developed that produce materials with a high TCR which promises to give an order of magnitude improvement in microbolometer sensitivity at which point the uncooled detector surpasses the cooled detector capabilities. These detectors have applications for IR imaging, including search and rescue and fire fighting.

Thin films of these metal doped rare earth doped manganites of the formula

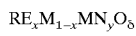

where
  RE is Y and the rare earths such as La, Ce, Pr, Nb, Pm, Sm, Eu, Gd, Tb, Dy, Ho, Er, Tm, Yb, Lm, and combinations thereof,
  M is a divalent metal such as Ca, Sr, Ba, Pb, and combinations thereof,
  x is less than 1,
  y is from about 0.75 to about 1.5, and
  δ is from about 2.5 to about 4.0, have been deposited by pulsed laser deposition (PLD). After annealing, the materials undergo an antiferromagnetic-ferromagnetic (AF-F) phase transition as a function of temperature when the material is cooled. The magnetic phase transition is determined by the film composition (RE, M, RE/M, (RE+M)/Mn and δ) and the density of defects (structural and magnetic) present in the material. The magnetic phase transition can be observed directly by measuring the change in magnetization as a function of temperature. Associated with the magnetic phase transition is a change in the electrical behavior of the material. As the material undergoes the AF-F transition, the resistance also changes. The temperature dependence of the resistivity switches from being activated (or semiconducting) to metallic. In the metallic phase, the material has a large temperature dependent resistivity which can be used to develop a high sensitivity bolometer.

The valance chemistry or oxygen state for Mn in the material can vary. In the case of $LaMnO_3$, for example, where oxygen, O, has a valence of −2 and La has +3, the Mn is +3 in the manganite form. The addition of "dopants" such as $Ca^{+2}$ as a substitution for some of the La is believed to lead to a mixture of Mn valances between +3 and +4. The ratio of $Mn^{+3}$ to $Mn^{+4}$ will vary and δ represents a charge balance to make the compound neutral.

As deposited, the films are single phase and well oriented, but are magnetically inhomogeneous. Annealing the films following deposition removes the magnetic inhomogeneities. There is a strong correlation between the degree of inhomogeneity and the magnitude of the TCR such that reducing the inhomogeneity increases the TCR. Only a narrow range of deposition and post processing conditions (such as, deposition temperature and ambient pressure, post deposition annealing time, temperature and ambient pressure) yield materials with a TCR near or at room temperature. Preferred deposition temperatures are 600°–900° C. Preferred oxygen pressures are 100–400 mTorr. An example of an annealing condition is 10 hours at about 1100° C.

While these materials are aggressively being investigated for their magnetic properties such as disclosed by E. O. Wollan et al. in "Neutron Diffraction Study of the Magnetic Properties of the Series of Perovskite-Type Compounds [(1−x)La, xCa]$MnO_3$," Physical Review, 100, No. 2, 545–563 (1955), their application for IR detectors has never been previously exploited.

In a preferred procedure, the $RE_xM_{1-x}Mn_yO_\delta$ films are deposited by pulsed laser deposition in a vacuum chamber which has a base pressure of typically of $10^{-7}$ Torr. During the film growth the chamber can be back-filled with pure oxygen at pressures up to about 1 Torr. and more preferably in the range of 50–1000 mTorr. Films are deposited onto a heated substrate positioned a few centimeters away from a stoichiometric target. A target composition determines the film composition since the target is evaporated and the vapor is collected on the substrate as a thin film. The substrate is preferably heated at a temperature in the range of 500°–900° C. Following deposition, a post-deposition treatment (heating or rapid thermal anneal) in oxygen or vacuum can be done to vary the oxygen stoichiometry and optimize film properties. Post deposition anneal temperatures can be up to 1100° C. with annealing times up to 72 hours. Generally it is preferred to have a minimum temperature of 500°–550° C. for the oxygen to migrate in or out of the thin film. At 550° C., oxygen is mobile and can either be diffused into the material (if the sample is in an oxygen atmosphere) or it can be diffused out (if the sample is in a vacuum). In this way, the value of y (oxygen stoichiometry) can easily be adjusted to generate a TCR maximum at the device operating temperature.

Films can be deposited directly onto $SiN_x$ or on a buffer layer provided on the $SiN_x$. These buffer layer aid in lattice matching when the thin film is deposited. It is believed that a buffer layer can help direct the manganite material to grow in the correct phase and optimum crystallographic orientation to provide a thin film with a high TCR. Examples of buffer layers are yttria stabilized zirconia (YSZ), $SrTiO_3$, $B_4Ti_3O_{12}$, $CoSi_2$, and $CeO_2$. The large TCR is only observed in thin films which are on the order of 500 to 5000 Angstrom units (0.05 $\mu$m to 0.5 $\mu$m) and it is not a bulk effect. It is not believed that anything technologically useful for this application will work with films thicker than about 1 $\mu$m. A real world device is going to want to use the minimum amount of material that is necessary to make the resistor work. Adding additional mass to the device by making the film thicker will only make it harder to raise the temperature of the bolometer and it will decrease the overall sensitivity of the device. At the other end of the film thickness range, a very thin film may work, but it is difficult to grow films that are less than 100 angstroms thick (<0.01 $\mu$m).

There are two ways to describe the sensitivity of the detector array. One is $D^*$, which is the detectivity where the larger the value, the better is the performance. The second is NETD (Noise equivalent temperature difference) or NEDT (Noise equivalent delta T) which are just a measure of how small a temperature difference the device can detect and the smaller the value the better. $V_xO_y$ based microbolometers have a NEDT of about 75 milli-K (mK) compared to a better and lower value of 30 mK for a semiconducting based detector. A bolometer with a coating that has a TCR of 20% is predicted to have an NEDT of 8 mK.

Currently, room temperature microbolometers which use $V_xO_y$ do not have the equivalent sensitivity of cooled semiconducting detectors. For HgCdTe (MCT), the measured $D^*$ is $5\times10^9$ Cm/Hz$^{1/2}$/Watt. For the microbolometer with an oxide coating that has a TCR, of $-2\%$, a significantly lower measured $D^*$ of $1.2\times10^9$ Cm/Hz$^{1/2}$/Watt is observed.

Predicted microbolometer sensitivities using $RE_xM_{1-x}Mn_yO_\delta$ thin films are $1.0-2.5\times10^{10}$ Cm/Hz$^{1/2}$/Watt for TCR's from 8 to 20% (i.e., equal to or greater than MCT). The NEDT of the bolometer is expected to exceed that of the cooled LWIR due to faster (about f/1) optics.

Currently, silicon microbridges are coated with a $V_xO_y$ thin film. State-of-the-art $V_xO_y$ has a reported $-2\%$ TCR at near room temperature. $RE_xM_{1-x}Mn_yO_\delta$ coatings, deposited by PLD onto single crystal substrates of LaAlO$_3$, have measured TCR's between 4 and 15% as seen in FIG. 1. These materials have not yet been optimized for use in IR detectors. It is expected that a TCR maximum can be obtained by varying the parameters of post annealing in oxygen.

If these materials were substituted for the $V_xO_y$ coatings, the resulting microbolometers are predicted to have greater sensitivities than the semiconducting based devices. Additional gains are realized for the microbolometer device in that it does not have to be cooled to achieve this sensitivity. The improvement in the detector sensitivity at a reduction in size, weight and power consumption are envisioned to be important for a number of military and commercial applications. Commercial applications include search and rescue and collision avoidance systems. Military applications include strategic surveillance systems and smart munitions.

The newly discovered materials have TCRs that exceed the current materials in use ($V_xO_y$ which is about $-2\%$). These new materials have electrical and optical properties that are compatible with Si processing technology. With a coating that has a TCR of 8%, the microbolometer sensitivity is equal to LWIR MCT. At 20%, the microbolometer sensitivity is predicted to be a factor of five greater for a detector that requires much less power and is lighter weight and less expensive than an MCT detector. With a TCR of 20%, the sensitivity of the microbolometer is increased by a factor of 10 over the current state of the art.

These materials are believed to be unique since there currently are no other known materials which are compatible with SiN$_x$ and which have a higher TCR than the $RE_xM_{1-x}Mn_yO_\delta$.

Having described the basic aspects of the invention, the following examples are given to illustrate specific embodiments thereof.

EXAMPLE 1

This example describes the production of two calcium doped lanthanum manganite thin films with a high TCR.

Two films were grown having a La$_{0.67}$Ca$_{0.33}$MnO$_\delta$ composition and a La$_{0.50}$Ca$_{0.25}$MnO$_\delta$ composition by pulsed laser deposition onto single crystal substrates of (100) LaAlO$_3$. The output of a short pulsed (30 ns FWHM which is full width of half maximum) excimer laser operating on KrF (248 nm) was focused to an energy density of about 2 J/cm$^2$ onto a stoichiometric target. The laser repetition rate was 10 Hz. La$_{0.67}$Ca$_{0.33}$MnO$_\delta$ targets were prepared from fully reacted powders by pressing ¾" diameter targets to 15,000 pounds and then annealing overnight in oxygen to a maximum temperature of 1300° C. The target-substrate distance was fixed at 3 cm. Films were deposited in 300 mTorr of flowing oxygen at about 10 sccm which is standard cubic centimeters per minute onto conductively heated substrates at 600° C.

Substrates were attached using silver paint to a stainless steel block which was heated by the output from two 360 W quartz-halogen lamps. The TCR was determined from resistivity versus temperature measurements made using a four point probe. The films were annealed in oxygen at 1100° C. for 12 hours.

FIG. 1 is a graph of the % TCR values as a function of temperature for calcium doped La manganite deposited by PLD onto a single crystal (001) LaAlO$_3$. The data shown in FIG. 1 indicate that both films have a maximum TCRs which are above 2% which is the current state of the art.

EXAMPLE 2

This example describes the production of a strontium doped La manganite.

The same procedure of Example 1 was repeated for an La$_{0.67}$Sr$_{0.33}$MnO$_\delta$ film. The film was grown by PLD with the substrate deposition temperature slightly higher at 650° C. and the oxygen deposition pressure was lower at 100 mTorr. This film was annealed in oxygen for 66 hours at 1050° C.

Figure 2:
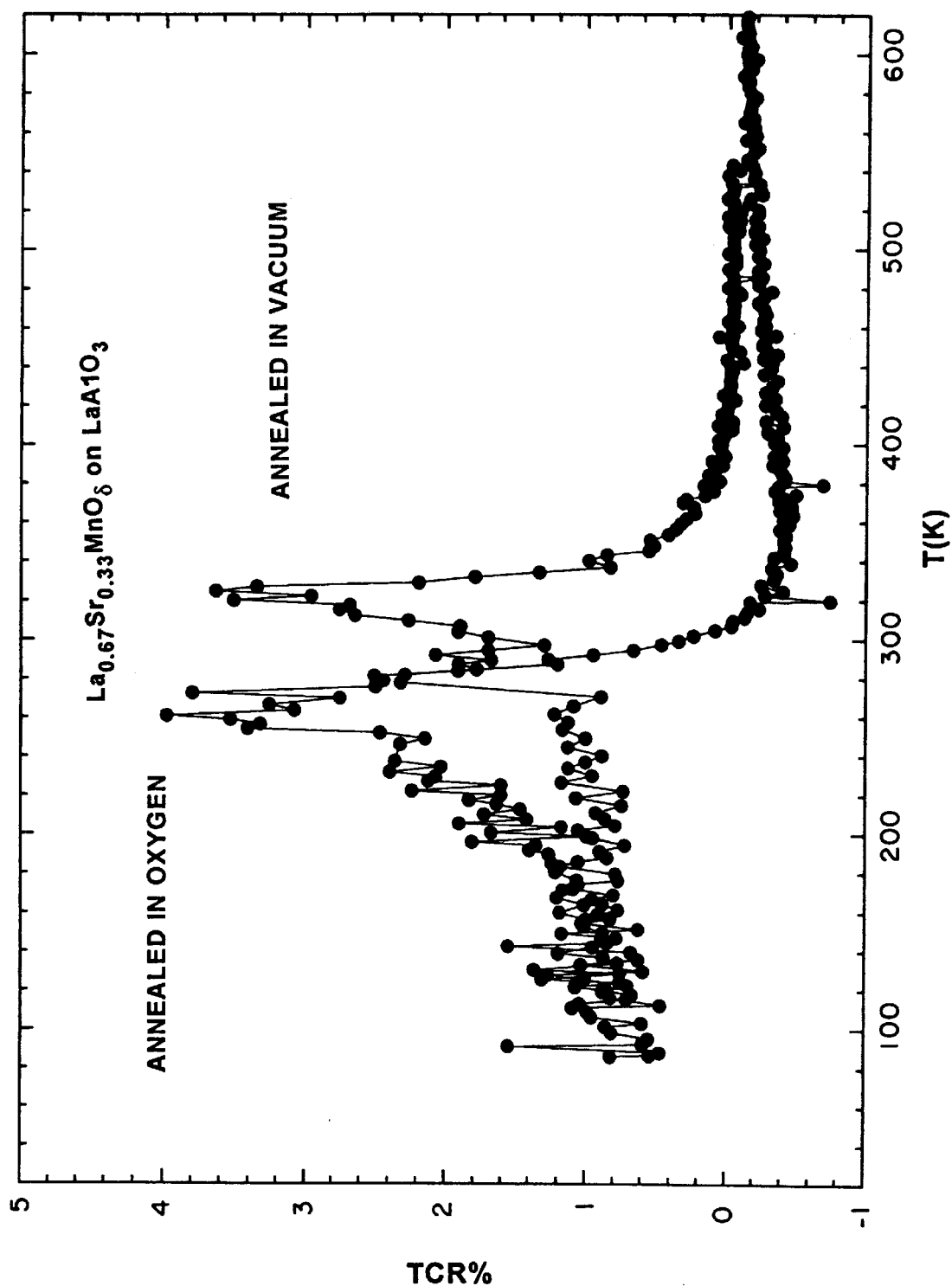
FIG. 2 is a graph of the resistance and % TCR values as a function of temperature for an strontium doped La manganite.

The maximum TCR for this material has been observed as 4% at 300° K as seen in FIG. 2 which is a graph of the resistance and % TCR values as a function of temperature for a strontium doped La manganite deposited by PLD onto a single crystal (001) LaAlO$_3$.

It is understood that the foregoing detailed description is given merely by way of illustration and that many variations may be made therein without departing from the spirit of this invention.

What is claimed is:

1. An improved microbolometer comprising:
   a thin film composition of matter, the thin film comprising:
   a manganite of the formula

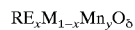

$RE_xM_{1-x}Mn_yO_\delta$ wherein
   RE is selected from the group consisting of Y and the rare earths, and combinations thereof,
   M is selected from the group consisting of divalent metals, and combinations thereof,
   x is less than 1, v is from about 0.75 to about 1.5, and δ is from about 2.5 to about 4.0; and a microbridge for measuring resistance changes due to temperature changes in the thin film, comprising a substrate having a cavity disposed thereon;

wherein the thin film is deposited on the microbridge.

2. An improved microbolometer according to claim 1, wherein the deposited thin film has been annealed to remove inhomogeneities and to decrease the defects so as to increase the TCR.

3. An improved microbolometer according to claim 1, wherein the substrate is $Si_3N_4$ or $LaAlO_3$.

4. An improved microbolometer according to claim 1, wherein a buffer layer is deposited between the substrate and the thin film.

5. An improved microbolometer according to claim 1, wherein the thin film has a thickness of less than about 1 μm.

6. An improved microbolometer according to claim 1, wherein the thin film has a thickness from about 0.05 to about 0.5 μm.

7. An improved microbolometer according to claim 1, wherein the manganite composition has a high temperature coefficient of resistance at near room temperature.

8. An improved microbolometer according to claim 7, wherein the high temperature coefficient of resistance is at least 4%.

9. An improved microbolometer according to claim 8, wherein the high temperature coefficient of resistance is at least 8%.

10. An improved microbolometer according to claim 1, wherein the manganite composition has a temperature coefficient of resistance of at least 4% at temperatures obtained by thermo-electric coolers.

11. An improved microbolometer according to claim 1, wherein the manganite composition has a temperature coefficient of resistance of at least 8% at temperatures obtained by thermo-electric coolers.

12. An improved microbolometer according to claim 1, wherein said thin film is disposed in zero applied magnetic field.

* * * * *

UNITED STATES PATENT AND TRADEMARK OFFICE
CERTIFICATE OF CORRECTION

PATENT NO. : 5,854,587
DATED : December 29, 1998
INVENTOR(S) : James Horwitz, Douglas Chrisey, John T. Caulfield and Paul C. Dorsey It is certified that error appears in the above-identified patent and that said Letters Patent is hereby corrected as shown below:

Title page, item 75: Replace "Paul E. Dorsey" with "Paul C. Dorsey".

Signed and Sealed this

Thirtieth Day of November, 1999

Attest:

Q. TODD DICKINSON

Attesting Officer

Acting Commissioner of Patents and Trademarks